US008278721B2

(12) United States Patent
Zhong et al.

(10) Patent No.: US 8,278,721 B2
(45) Date of Patent: Oct. 2, 2012

(54) CONTACT HOLE, SEMICONDUCTOR DEVICE AND METHOD FOR FORMING THE SAME

(75) Inventors: Huicai Zhong, Beijing (CN); Qingqing Liang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/119,513

(22) PCT Filed: Feb. 24, 2011

(86) PCT No.: PCT/CN2011/071254
§ 371 (c)(1),
(2), (4) Date: Mar. 17, 2011

(87) PCT Pub. No.: WO2011/140850
PCT Pub. Date: Nov. 17, 2011

(65) Prior Publication Data
US 2011/0281413 A1    Nov. 17, 2011

(30) Foreign Application Priority Data

May 14, 2010  (CN) .......................... 2010 1 0175815

(51) Int. Cl.
*H01L 21/02* (2006.01)
(52) U.S. Cl. . 257/382; 257/383; 257/900; 257/E29.143; 257/E21.626; 257/E21.64; 257/E21.649; 438/586; 438/595; 438/597; 438/621; 438/675
(58) Field of Classification Search .................. 257/382, 257/383, 900, E29.143, E21.626, E21.64, 257/E21.649; 438/586, 595, 597, 621, 675
See application file for complete search history.

(56) References Cited

U.S. PATENT DOCUMENTS

| | | | |
|---|---|---|---|
| 5,200,352 A | 4/1993 | Pfiester | |
| 5,319,232 A | 6/1994 | Pfiester | |
| 6,165,901 A | 12/2000 | Hsu | |
| 6,790,731 B2 * | 9/2004 | Zheng et al. | 438/283 |
| 2007/0102775 A1 * | 5/2007 | Kwon | 257/411 |
| 2008/0230845 A1 * | 9/2008 | Okonogi et al. | 257/382 |
| 2008/0233743 A1 * | 9/2008 | Costrini et al. | 438/675 |
| 2009/0209096 A1 * | 8/2009 | Lee et al. | 438/586 |
| 2009/0209100 A1 * | 8/2009 | Chen et al. | 438/675 |
| 2012/0126331 A1 * | 5/2012 | Lin et al. | 257/369 |

OTHER PUBLICATIONS

PCT International Search Report (PCT/CN2011/071254) (English Translation Jun. 9, 2011).
PCT International Search Report (May 14, 2010).

* cited by examiner

*Primary Examiner* — Asok Sarkar
(74) *Attorney, Agent, or Firm* — Goodwin Procter LLP

(57) ABSTRACT

The invention provides a method for forming a contact plug, comprising: forming a gate, a sidewall spacer, a sacrificial sidewall spacer, a source region and a drain region on a substrate, wherein the sidewall spacer is formed around the gate, the sacrificial sidewall spacer is formed over the sidewall spacer, and the source region and the drain region are formed within the substrate and on respective sides of the gate; forming an interlayer dielectric layer, with the gate, the sidewall spacer and the sacrificial sidewall spacer being exposed; removing the sacrificial sidewall spacer to form a contact space, the sacrificial sidewall spacer material being different from that of the gate, the sidewall spacer and the interlayer dielectric layer; forming a conducting layer to fill the contact space; and cutting off the conducting layer, to form at least two conductors connected to the source region and the drain region respectively.

20 Claims, 8 Drawing Sheets the present invention          Prior Art

CONTACT HOLE, SEMICONDUCTOR DEVICE AND METHOD FOR FORMING THE SAME

CROSS REFERENCE TO RELATED APPLICATIONS

The present application claims priority to PCT Application No. PCT/CN2011/071254, filed Feb. 24, 2011, which claimed priority to Chinese Patent Application No. 201010175815.5, entitled "CONTACT PLUG, SEMICONDUCTOR DEVICE AND METHOD FOR FORMING THE SAME", filed May 14, 2010. Both the PCT application and the Chinese application are incorporated herein by reference in their entireties.

FIELD OF THE INVENTION

The present invention relates to the field of semiconductor technology, and in particular, to a contact plug, a semiconductor device and a method for forming the same.

BACKGROUND OF THE INVENTION

As the feature size of semiconductor devices is scaled, various microcosmic effects have been observed, resulting in more complex manufacturing processes of semiconductor devices, and difficulties in optimizing their performances. Complex manufacturing processes require more masks and multistage photolithography, and it has become a challenging and practicable research topic in the optimization of semiconductor device performance to improve the manufacturing technique of contact plugs.

Specifically, a conventional method for forming a contact hole comprises: as shown in FIG. 1, forming a gate 14 and a sidewall spacer 16 on a substrate 10, the gate 14 being formed on the substrate 10 via a gate dielectric layer 12, and the sidewall spacer 16 being formed to cover the opposite sides of the gate 14, and further forming source and drain regions (not shown) and a silicide contact region 18; as shown in FIG. 2, forming an interlayer dielectric layer (ILD) 20 with the gate 14 and the sidewall spacer 16 being exposed; and, as shown in FIG. 3, etching the interlayer dielectric layer 20 using a mask to form the contact hole 30.

As can be seen, with the method above, a mask is required in etching the interlayer dielectric layer 20 to form the contact hole 30. However, if the size of the contact hole 30 is reduced, the contact hole 30 meeting the process requirements may not be obtained using the mask, i.e., the desired function of the mask may not necessarily be realized. Therefore, an object of the present invention is to form a contact plug without a mask.

SUMMARY OF THE INVENTION

In order to solve the technical problem above, the invention provides a contact plug and a method for forming the contact plug, which may reduce the number of masks used in forming the contact plug. The invention also provides a semiconductor device and a method for forming the semiconductor device, with reduced number of masks used in forming the semiconductor device.

The invention provides a method for forming a contact plug, including:

forming a gate, a sidewall spacer, a sacrificial sidewall spacer, a source region and a drain region on a substrate, wherein the sidewall spacer is formed around the gate, the sacrificial sidewall spacer is formed over the sidewall spacer, and the source region and the drain region are formed within the substrate and on respective sides of the gate;

forming an interlayer dielectric layer, with the gate, the sidewall spacer and the sacrificial sidewall spacer being exposed;

removing the sacrificial sidewall spacer to form a contact space, a material that the sacrificial sidewall spacer is made of being different from any of materials that the gate, the sidewall spacer and the interlayer dielectric layer are made of;

forming a conducting layer to fill the contact space; and cutting off the conducting layer, to form at least two conductors connected to the source region and the drain region, respectively.

Optionally, the method further comprises the following step between forming the sacrificial sidewall spacer and forming the interlayer dielectric layer:

forming an auxiliary sidewall spacer over a side of the sacrificial sidewall spacer, a material of the auxiliary sidewall spacer being different from either of the materials of the sacrificial sidewall spacer and the interlayer dielectric layer.

Optionally, the sidewall spacer comprises a sidewall spacer base layer and a main sidewall spacer, a material of the main sidewall spacer is different from the material of the sacrificial sidewall spacer, and the sidewall spacer base layer is sandwiched between the main sidewall spacer and each of the sides of the gate, and the method further comprises the following steps after forming the conducting layer:

removing the main sidewall spacer, to form an adjusted region; and forming a dielectric layer to fill the adjusted region.

Optionally, the material of the auxiliary sidewall spacer is the same as the material of the main sidewall spacer.

The invention provides a method for forming a contact plug, comprising:

forming, on a substrate, a gate stack a sidewall spacer and a sacrificial sidewall spacer extending in a first direction, wherein the sidewall spacer is formed over each of the opposite sides of the gate stack, and the sacrificial sidewall spacer is formed over the sidewall spacer;

forming an interlayer dielectric layer, with the gate stack, the sidewall spacer and the sacrificial sidewall spacer being exposed;

removing the sacrificial sidewall spacer to form a contact space, a material that the sacrificial sidewall spacer is made of being different from any of materials that the gate stack, the sidewall spacer and the interlayer dielectric layer are made of;

forming a conducting layer to fill the contact space; and forming a gate from the gate stack, and cutting the gate and the conducting layer in a second direction different from the first direction.

Optionally, the method further comprises the following step between forming the sacrificial sidewall spacer and forming the interlayer dielectric layer:

forming an auxiliary sidewall spacer over a side of the sacrificial sidewall spacer, a material of the auxiliary sidewall spacer being different from either of the materials of the sacrificial sidewall spacer and the interlayer dielectric layer.

Optionally, the sidewall spacer comprises a sidewall spacer base layer and a main sidewall spacer, a material of the main sidewall spacer is different from the material of the sacrificial sidewall spacer, and the sidewall spacer base layer is sandwiched between the main sidewall spacer and each of the sides of the gate, and the method further comprises the following steps after forming the conducting layer:

removing the main sidewall spacer, to form an adjusted region; and forming a dielectric layer to fill the adjusted region.

Optionally, the material of the auxiliary sidewall spacer is the same as the material of the main sidewall spacer.

The invention provides a method for forming a semiconductor device, comprising:

forming a gate and a sidewall spacer on a substrate; and forming a contact plug on the substrate formed with the gate and the sidewall spacer, wherein the contact plug is formed with the method above.

The invention provides a contact plug, the contact plug a gate and a sidewall spacer being formed on a substrate and within an interlayer dielectric layer, wherein the sides of the contact plug meet the sidewall spacer.

Optionally, an auxiliary sidewall spacer is formed within the interlayer dielectric layer, a material that the auxiliary sidewall spacer is made of is different from a material that the interlayer dielectric layer is made of, and a side of the contact plug that opposes to a side of the contact plug meeting the sidewall spacer meets the auxiliary sidewall spacer.

Optionally, the sidewall spacer comprises a sidewall spacer base layer and a main sidewall spacer, the sidewall spacer base layer is sandwiched between the main sidewall spacer and the gate, a material of the main sidewall spacer is different from a material of the sidewall spacer base layer, and the material of the main sidewall spacer is the same as the material of the interlayer dielectric layer.

The invention provides a semiconductor device comprising the contact plug above.

Optionally, the gate comprises a first part and a second part, wherein the second part is on the first part, and a material of the second part is the same as the material of the contact plug.

The technical solutions provided by the invention have the following advantages over the prior art:

The contact plug is formed by forming the sacrificial sidewall spacer over the sidewall spacer, removing the sacrificial sidewall spacer after forming the interlayer dielectric layer, and filling the formed contact space with the conducting layer. In other words, the contact plug is formed with a self-aligning process, resulting in reduced number of number of masks. Moreover, the contact plug is formed in the contact space resulting from the removal of the sacrificial sidewall spacer, which was over the sidewall spacer, i.e., the contact plug meets the sidewall spacer, which may lead to a reduced device size and improved mobility of carriers in the channel region of the device. In addition, the sacrificial sidewall spacer covers the sidewall spacer and further over each of the opposite sides of the gate. Therefore, the formed contact plug covers each of the opposite sides of the gate when the sacrificial sidewall spacer is removed. Compared with the contact plug obtained with local etching using a mask according to the conventional method, the contact plug may have an increased contact region with the substrate, lowering the contact resistance.

With the auxiliary sidewall spacer formed over a side of the sacrificial sidewall spacer, and the material of the auxiliary sidewall spacer being different from the materials of the sacrificial sidewall spacer and the interlayer dielectric layer, the sidewall spacer (or, the main sidewall spacer) and the auxiliary sidewall spacer can be used as a barrier layer by appropriately selected techniques in removing the sacrificial sidewall spacer to form the contact space, thereby optimizing the profile of the contact space, and further optimizing the profile of the contact plug.

If the sidewall spacer base layer is sandwiched between the main sidewall spacer and each of the sides of the gate, after the formation of the contact plug, the main sidewall spacer may be removed to form the adjusted space, and by flexibly selecting the material and formation method of the dielectric layer filling the adjusted space, device performance may be improved. Specifically, by selecting a material having a low dielectric constant as the dialectic layer, the adjusted space is filled with the material having a low dielectric constant, which may reduce delay effects due to parasitic resistance/capacitance; and by selecting a material with a specific stress as the dielectric layer, the adjusted space is filled with the material with a specific stress, which may adjust the stress in the channel region of the device, and improve the mobility of carriers in the channel region.

With the auxiliary sidewall spacer made of the same material as the main sidewall spacer, the auxiliary sidewall spacer can be removed along with the main sidewall spacer, which makes the technical solution provided by the invention compatible with the conventional method.

In the method where a gate is formed first and then a contact plug is formed with a self-aligning process (i.e., forming a gate stack extending in a first direction, forming a gate from the gate stack and cutting the gate in a second direction different from the first direction, and then forming a contact plug with the self-aligning process), after the gate stack is cut, gaps are formed between gates, and contact plugs are to be formed in the gaps. As the size of the gaps decreases, the possibility of interconnection between the contact plugs increases. With an adjusted method for forming a gate, which comprises: forming a gate stack extending in a first direction, forming a contact plug with a self-aligning process, and then forming the gate from the gate stack and cutting the gate in a second direction different from the first direction; the contact plug is also cut in forming the gate. Then, in forming the next interlayer dielectric layer, the gaps between gates and between contact plugs resulting from the cutting are filled with the interlayer dielectric layer, which realizes isolation and may further lead to a reduced possibility of interconnection between the contact plugs.

As a result of the removal of the sacrificial sidewall spacer to produce the contact space, the exposed gate is also partially removed in its thickness. In forming the conducting layer to fill the contact space, a remaining space of the gate resulting from the partial removal of its thickness is filled with the conducting layer. As the conducting layer normally has an electrical conductivity higher than that of the gate, therefore, with the partial replacement of the gate with the conducting layer, the resistance of the gate may be lowered.

DETAILED DESCRIPTION OF THE INVENTION

Figure 1:
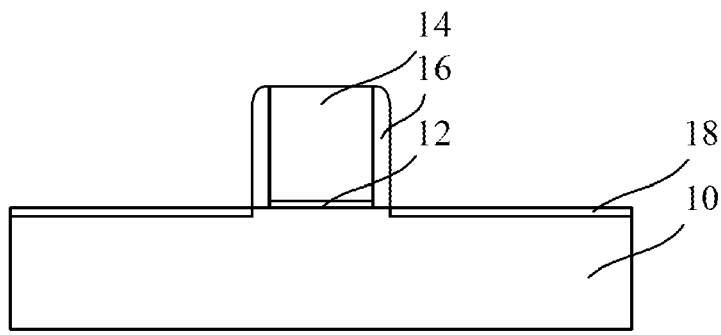
FIG. 1 to FIG. 3 illustrate intermediate structures of the respective steps of the conventional method for forming a contact plug.
Figure 2:
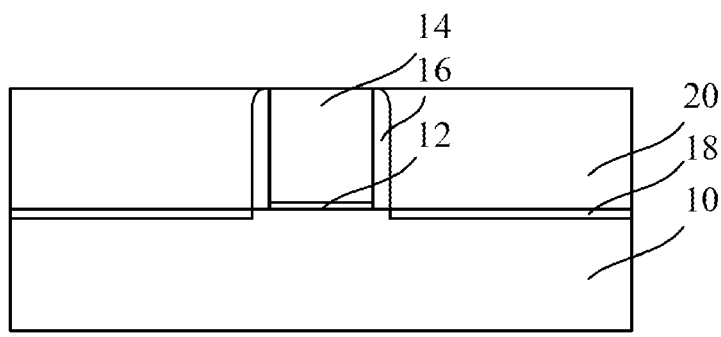
Figure 3:
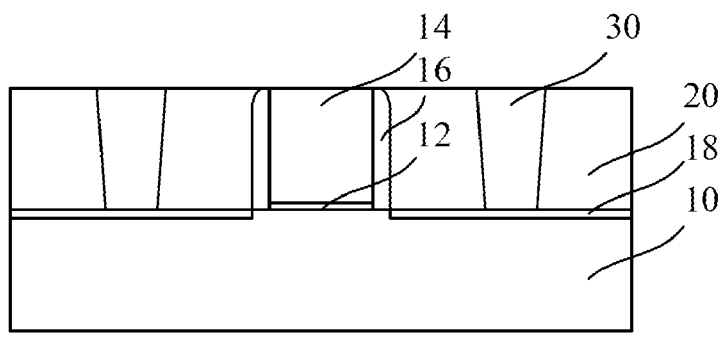

A number of embodiments or examples implementing the technical solutions provided by the invention are described hereinafter. Components and arrangements in specific examples are described in the following. However, those components and arrangements are for illustration purposes only, and are not intended to limit the scope of the invention.

Moreover, different embodiments of the invention may use the same reference numerals and/or letters, which is for conciseness and clarity purposes, and does not represent the relationships between the embodiments and/arrangements described herein.

The invention provides examples with particular processes and/or materials; however, it shall be appreciated by those skilled in the art that alternative processes and/or materials may be made without deviation from the scope of the invention. It should be noted that the bounds of the various regions described herein include any necessary extensions made as needed by the process or technique.

According to a first embodiment of the invention, a method for forming a contact plug comprises the following steps.

Figure 4:
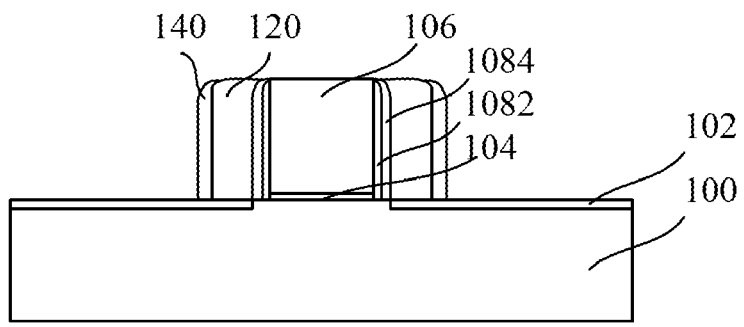
FIG. 4 to FIG. 10 illustrate intermediate structures of respective steps of a method for forming a contact plug according to a first embodiment of the invention.

First, as shown in FIG. 4, a gate 106 (on a pre-formed gate dielectric layer 104), a sidewall spacer, a sacrificial sidewall spacer 120, a source region, a drain region (not shown), and an auxiliary sidewall spacer 140 are formed on a substrate 100. The sidewall spacer covers opposite sides of the gate 106, the sacrificial sidewall spacer 120 covers the sidewall spacer, the auxiliary sidewall spacer 140 covers side surfaces of the sacrificial sidewall spacer 120, and the source region and the drain region are within the substrate and on respective sides of the gate.

In this specification, the substrate 100 has undergone a processing operation, which comprises pre-cleaning, forming well regions and forming a shallow trench isolation (STI) region. In this embodiment, the substrate 100 is a silicon substrate. In other embodiments, the substrate 100 may comprise other compound semiconductors, e.g., silicon carbide, gallium arsenide, indium arsenide or indium phosphide. Preferably, the substrate 100 comprises an epitaxial layer. In addition, the substrate 100 may comprise a silicon-on-insulator (SOI) structure.

In this embodiment, the gate 106 is a metal gate (e.g., a stack of a work function-determining metal layer and an aluminum/stacked aluminum-copper electrode, with the work function metal layer comprising one or more of TiN, TiAlN, TaN and TaAlN). The metal gate may be formed with a gate-first process or a gate-last process.

In other embodiments, the gate 106 may be a polysilicon gate. The gate 106 may be formed with conventional processes and materials.

The sidewall spacer may be made of any one or more of silicon nitride, silicon oxynitride and silicon carbide. The sidewall spacer may have a multilayered structure. For example, the sidewall spacer may comprise a sidewall spacer base layer 1082 and a main sidewall spacer 1084, and the material of which the sidewall spacer base layer 1082 is made may be different from that of the main sidewall spacer 1084. Specifically, in this embodiment, the sidewall spacer base layer 1082 may be made of silicon oxynitride, and the main sidewall spacer 1084 may be made of silicon nitride. In such a case, the main sidewall spacer 1084 may still have a stacked structure. For example, the main sidewall spacer 1084 may have a stacked silicon nitride-silicon oxynitride-silicon nitride structure. The main sidewall spacer 1084 cover side surfaces of the gate 106 with the sidewall spacer base layer 1082 therebetween, i.e., the sidewall spacer base layer 1082 is sandwiched between the main sidewall spacer 1084 and the side surfaces of the gate 106.

The sacrificial sidewall spacer 120 may be made of any one or more of polysilicon, amorphous silicon, silicon nitride, silicon oxide, silicon oxynitride and silicon carbide. The material of the sacrificial sidewall spacer 120 may be different from any of the materials of the gate 106, the sidewall spacer and a subsequent interlayer dielectric layer. As an example, in this embodiment, if the gate 106 is an aluminium-copper stack electrode, the sidewall spacer is made of silicon nitride and the subsequent interlayer dielectric layer is made of doped silicon oxide, the sacrificial sidewall spacer 120 may be made of polysilicon or amorphous silicon.

The auxiliary sidewall spacer 140 may be made of any one or more of silicon nitride, silicon oxynitride and silicon carbide. The material of the auxiliary sidewall spacer 140 may be different from the materials of the sacrificial sidewall spacer 120 and the subsequent interlayer dielectric layer. Specifically, in this embodiment, if the sacrificial sidewall spacer 120 is made of polysilicon or amorphous silicon and the subsequent interlayer dielectric layer is made of doped silicon oxide, the auxiliary sidewall spacer 140 may be made of silicon nitride.

The sidewall spacer, the sacrificial sidewall spacer 120 and the auxiliary sidewall spacer 140 may be formed with a self-aligning process. The sidewall spacer, the sacrificial sidewall spacer 120 and the auxiliary sidewall spacer 140 may be formed with Pulsed Laser Deposition (PLD), Atomic Layer Deposition (ALD), Plasma-Enhanced Atomic Layer Deposition (PEALD) or other suitable deposition techniques in combination with dry or wet etching.

The source region, the drain region (not shown) and a contact region 102 (e.g., a metal silicide layer, formed by depositing metals on the source and drain regions and subsequent annealing, with the metals comprising any one or more of Co, Ni, Mo, Pt and W, and the contact region 102 being adapted to reduce the contact resistance between a conducting material filling the contact plug and the source and drain regions) may be formed after the formation of the sidewall spacer. Alternatively, the contact region 102 may be formed after subsequent removal of the sacrificial sidewall spacer 120 and before formation of a conducting layer which replaces the contact region 102.

Figure 5:
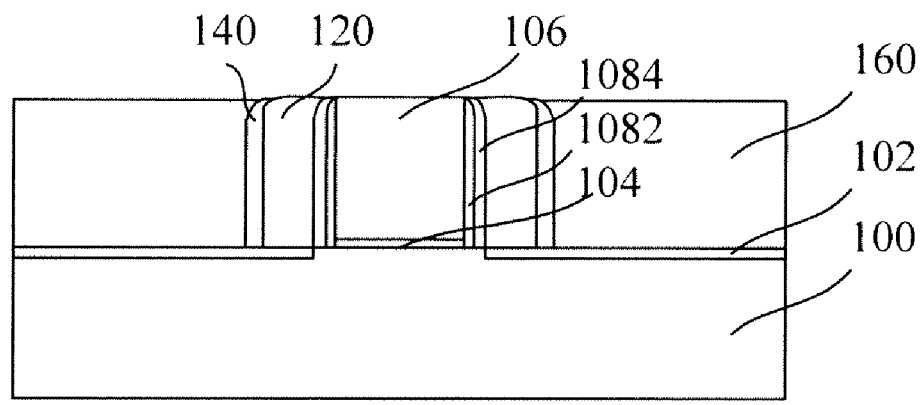

Then, as shown in FIG. 5, the interlayer dielectric layer 160 is formed, with the gate 106, the sidewall spacer and the sacrificial sidewall spacer 120 being exposed.

Specifically, the interlayer dielectric layer 160 may be formed firstly to cover the substrate 100 with the gate 106, the sidewall spacer, the sacrificial sidewall spacer 120 and the auxiliary sidewall spacer 140 formed thereon. Then, the interlayer dielectric layer 160 may be planarized to expose the gate 106, the sidewall spacer and the sacrificial sidewall spacer 120; the auxiliary sidewall spacer 140 may also be exposed, which is made of a material different from those of the sacrificial sidewall spacer 120 and the interlayer dielectric layer 160.

The planarizing process may be performed using Chemical Mechanical Polishing (CMP) method. The interlayer dielectric layer 160 may comprise any one or more of doped (e.g., fluorinated silicate glass, borosilicate glass, phosphosilicate glass, borophosphosilicate glass, silicon oxycarbide, silicon oxy-nitric-carbide) or undoped silicon oxide glass, or a dielectric material with a low dielectric constant (e.g., black diamond, coral). The interlayer dielectric layer 160 may have a multilayered structure. The interlayer dielectric layer 160 may be formed with any conventional processes, which is omitted here for clarity.

Figure 6:
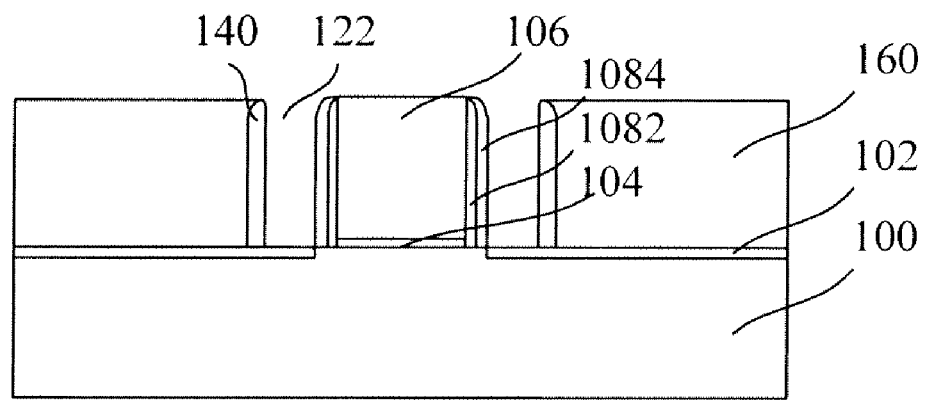

Next, as shown in FIG. 6, the sacrificial sidewall spacer 120 is removed to form an opencontact space 122.

The sacrificial sidewall spacer 120 may be removed with dry etching or wet etching method, e.g., Reactive Ion Etching (RIE).

Then, as the material of the sacrificial sidewall spacer 120 is different from the materials of the sidewall spacer, the auxiliary sidewall spacer 140 and the interlayer dielectric layer 160, the sidewall spacer and the auxiliary sidewall spacer 140 can be used as a barrier layer in removing the sacrificial sidewall spacer 120, and with appropriately selective removal techniques, damages to the interlayer dielectric layer 160 caused by the removing process can be minimized. This is beneficial for optimizing the profile of the contact space 122, and further for optimizing the profile of the subsequently formed contact plug. In other embodiments, the auxiliary sidewall spacer 140 may not be formed, in which case the sidewall spacer and the interlayer dielectric layer 160 can be used as a barrier layer in removing the sacrificial sidewall spacer 120.

Figure 7:
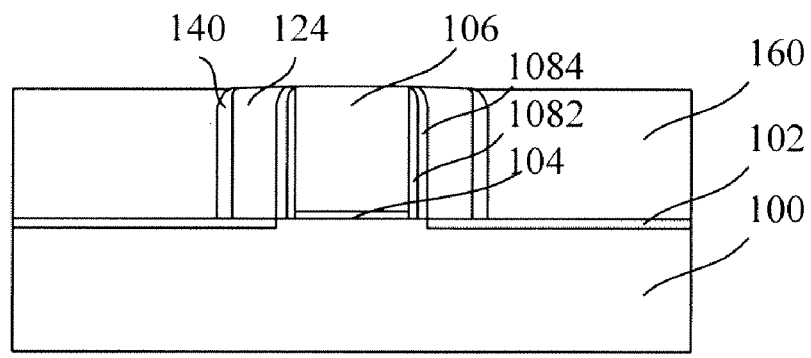

Next, as shown in FIG. 7, the conducting layer is formed to fill the contact space 122.

The conducting layer comprises a contact liner (e.g., any one or more of TiN, Ti, TaN and Ta) and a metal layer over the contact liner (e.g., any one or more of Al, Ti, TiAl, Ta, W and Cu; in this embodiment, the metal layer may be stacked Al and Cu). The conducting layer may be formed with sputtering, Pulsed Laser Deposition (PLD), Metal Organic Chemical Vapor Deposition (MOCVD), Atomic Layer Deposition (ALD), Plasma-Enhanced Atomic Layer Deposition (PEALD) or other suitable techniques.

After filling the contact space 122 with the conducting layer, a planarizing process such as CMP is performed to form the contact via 124.

Finally, the conducting layer is cut off to form at least two conductors connected to the source region and the drain region, respectively.

In other embodiments, the method may further comprise the following steps before or after cutting off the conducting layer.

Figure 8:
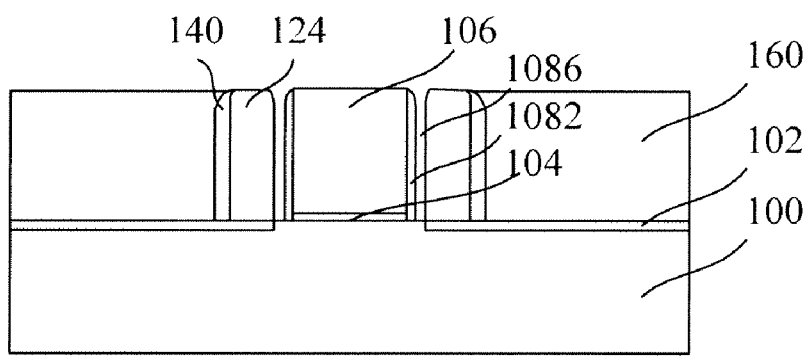

First, as shown in FIG. 8, the main sidewall spacer 1084 is removed to form an adjusted space 1086.

The main sidewall spacer 1084 may be removed with dry etching or wet etching, e.g., Reactive Ion Etching (RIE). Then, as the material of the main sidewall spacer 1084 is different from those of the sidewall spacer base layer 1082 and the contact via 124, the sidewall spacer base layer 1082 and the contact via 124 can be used as a barrier layer in removing the main sidewall spacer 1084, and with appropriately selective removal techniques, damages to the gate 106 and the interlayer dielectric layer 160 caused by the removing process can be minimized.

Figure 9:
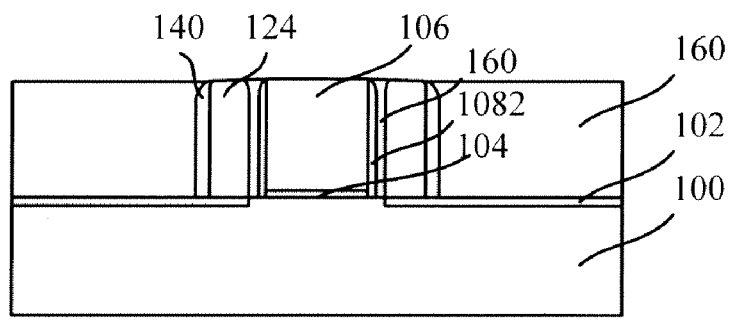

Then, as shown in FIG. 9, a dielectric layer is formed to fill the adjusted space 1086.

The dielectric layer can be the next interlayer dielectric layer 160. Please refer to the foregoing descriptions for the formation and material of the interlayer dielectric layer 160, which are omitted here. Filling the adjusted space 1086 with a material having a low dielectric constant may reduce delay effects due to parasitic resistance/capacitance; and filling the adjusted space 1086 with a material with certain stress may tune the stress in the channel region of the device, thereby improving the mobility of carriers in the channel region.

Figure 10:
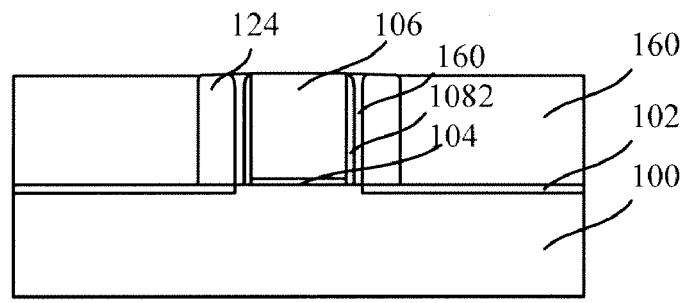

Particularly, as shown in FIG. 10, in another embodiment, the auxiliary sidewall spacer 140 may be made of the same material as the main sidewall spacer 1084. Then, the auxiliary sidewall spacer 140 can be removed along with the removal of the main sidewall spacer 1084, which makes the technical solution provided by the invention compatible with the conventional method.

Figure 11:
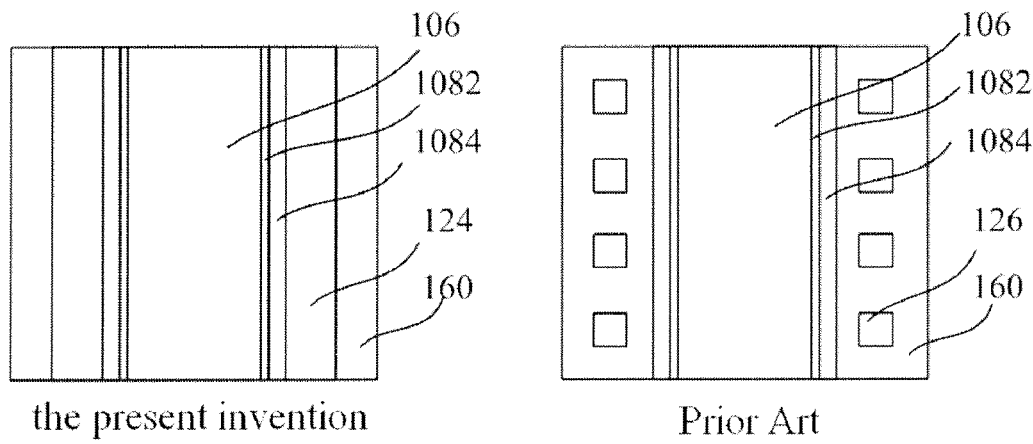
FIG. 11 illustrates a comparison between contact plugs formed with the conventional method and with the embodiment of the invention.

The contact plug is formed by forming the sacrificial sidewall spacer to cover the sidewall spacer, removing the sacrificial sidewall spacer after forming the interlayer dielectric layer, and filling the formed open contact space with conducting layers. In other words, the contact plug is formed with a self-aligning process, resulting in reduced number of masks. Moreover, the contact plug is formed in the contact space resulting from the removal of the sacrificial sidewall spacer which covers the sidewall spacer, i.e., the contact plug abuts on the sidewall spacer, which may lead to a reduced device size and improved mobility of carriers in the channel region of the device. In addition, as shown in FIG. 11, in the example above where the contact plug is formed without the formation of the auxiliary sidewall spacer, the sacrificial sidewall spacer 120 covers the sidewall spacer and further covers opposite sides of the gate 106. Therefore, the formed contact via 124 covers opposite sides of the gate 106 when the sacrificial sidewall spacer 120 is removed. Compared with the contact plug 126 obtained by local etching using a mask according to the conventional method, the contact via 124 may have an increased contact region with the substrate, which may be beneficial to reducing the contact resistance.

According to a second embodiment of the invention, a method for forming a contact plug comprises the following steps.

Figure 12:
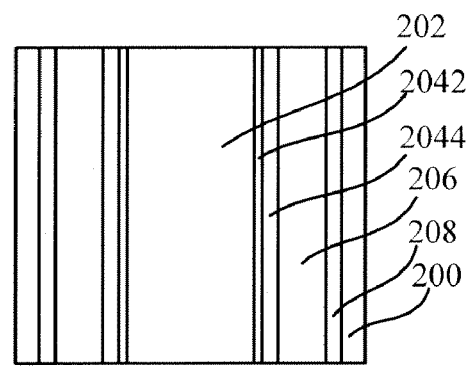
FIG. 12 to FIG. 19 illustrate intermediate structures of respective steps of a method for forming a contact plug according to a second embodiment of the invention.

First, as shown in FIG. 12, a gate stack202, a sidewall spacer, a sacrificial sidewall spacer 206 and an auxiliary sidewall spacer 208 extending in a first direction are formed on a substrate 200. The sidewall spacer covers opposite sides of the gate stack 202, the sacrificial sidewall spacer 206 covers the sidewall spacer, and the auxiliary sidewall spacer 208 covers side surfaces of the sacrificial sidewall spacer 206.

The formation and materials of the substrate 200, the sidewall spacer (comprising a sidewall spacer base layer 2042 and a main sidewall spacer 2044), the sacrificial sidewall spacer 206 and the auxiliary sidewall spacer 208 are the same as those in the preceding embodiment, which are omitted here.

In the prior art, a method for forming a gate comprises the steps of: forming a gate stack 202 extending in a first direction, and then cutting the gate stack 202 in a second direction different from the first direction to form the gate. Therefore, a method for forming a contact plug according an embodiment of the invention may be based on the prior art and the embodiments discussed above, which comprises forming a gate stack 202, forming a gate from the gate stack 202 and cutting the gate, and then forming a contact plug with a self-aligning process (after the formation of the contact plug, the conducting layer filling the contact plug is to be cut off, so as to form at least two conductors connected to the source region and the drain region, respectively).

However, in this embodiment, the step for forming the gate is not performed immediately after forming the gate stack 202. The gate is formed from the gate stack 202 and is cut after the formation of the contact plug with a self-aligning process.

The gate stack 202 may be made of metals (e.g., comprising a stack of a work function metal layer and a main metal layer, or comprising a stack of a work function metal layer, a main metal layer and an auxiliary metal layer, with the work function metal layer comprising any one or more of TiN, TiAlN, TaN and TaAlN, and the main metal layer and the auxiliary metal layer comprising any one or more of Al, Ti, Ta, W and Cu) or polysilicon, and the gate stack 202 may be formed with the gate-first or replacement gate process. The metals or polysilicon may be formed with any conventional processes.

In this embodiment, if the sidewall spacer base layer 2042 is made of silicon oxynitride, the main sidewall spacer 2044 is made of silicon nitride, and the subsequent interlayer dielectric layer is made of doped silicon oxide, then the sacrificial sidewall spacer 206 may be made of polysilicon or amorphous silicon, and the auxiliary sidewall spacer 208 may be made of silicon nitride. In other embodiments, the auxiliary sidewall spacer 208 may not be formed.

Figure 13:
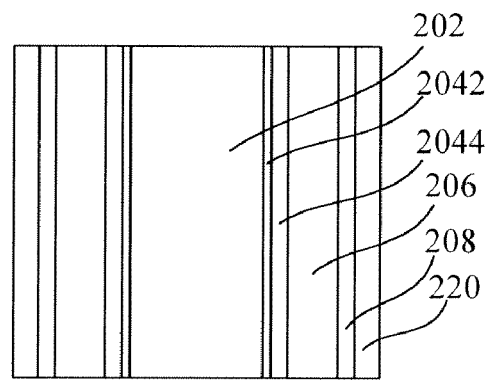

Then, as shown in FIG. 13, the interlayer dielectric layer 220 is formed, with the gate stack 202, the sidewall spacer, the sacrificial sidewall spacer 206 and the auxiliary sidewall spacer 208 being exposed. The auxiliary sidewall spacer 208 may not be exposed when the interlayer dielectric layer 220 is planarized.

Figure 14:
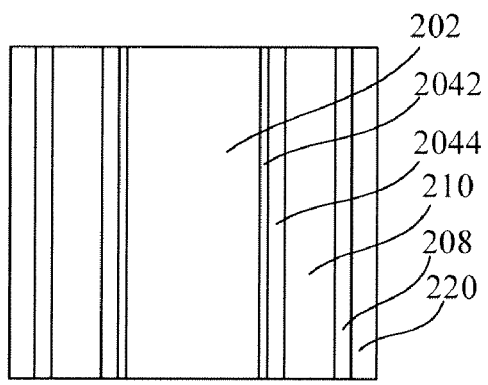

Next, as shown in FIG. 14, the sacrificial sidewall spacer 206 is removed to form a contact space, and the material of the sacrificial sidewall spacer 206 is different from those of the gate stack 202, the sidewall spacer and the interlayer dielectric layer 220. A contact region 210 formed on the substrate 200 is exposed when the sacrificial sidewall spacer 206 is removed.

Figure 15:
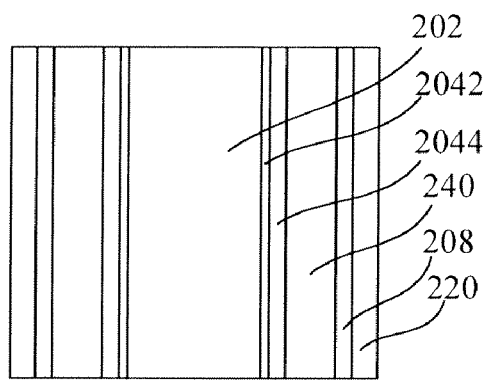

Then, as shown in FIG. 15, a conducting layer is formed to fill the contact space, so as to form a contact plug 240.

In other embodiments, the method may further comprise the following steps after forming the conducting layer.

Figure 16:
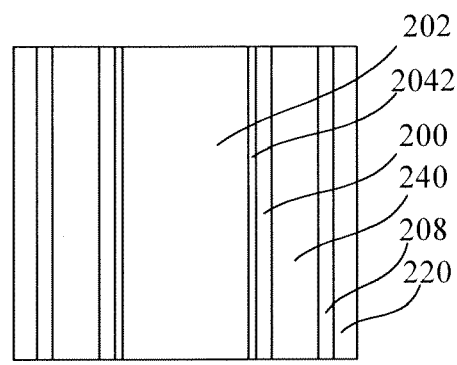

First, as shown in FIG. 16, the main sidewall spacer 2044 is removed to form an adjusting space. The substrate 200 is exposed when the main sidewall spacer 2044 is removed.

Then, as the material of the main sidewall spacer 2044 is different from the materials of the sidewall spacer base layer 2042 and the contact plug 240, the sidewall spacer base layer 2042 and the contact plug 240 can be used as a barrier layer in removing the main sidewall spacer 2044, and with appropriately selected techniques, damages to the gate stack 202 and the interlayer dielectric layer 220 caused by the removing process can be minimized.

Figure 17:
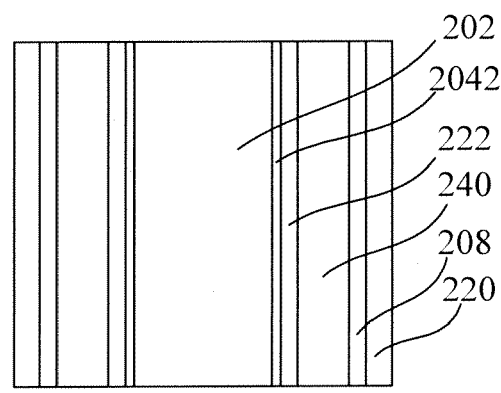

Next, as shown in FIG. 17, a dielectric layer 222 is formed to fill the adjusting space.

The dielectric layer 222 can be the same as interlayer dielectric layer. Filling the adjusted space with a material having a low dielectric constant may reduce delay effects due to parasitic resistance/capacitance; and filling the adjusted space with a material with a specific stress may adjust the stress in the channel region of the device, thereby improving the mobility of carriers in the channel region.

Figure 18:
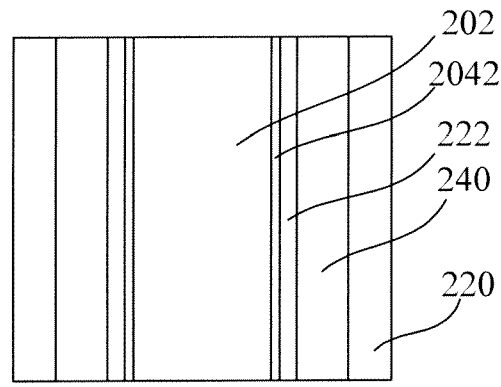

Particularly, as shown in FIG. 18, the auxiliary sidewall spacer 208 may be made of the same material as the main sidewall spacer 2044. Then, the auxiliary sidewall spacer 208 can be removed along with the main sidewall spacer 2044, which makes the technical solution provided by the invention compatible with the conventional method.

Particularly, the formations and materials of the interlayer dielectric layer 220, the conducting layer and the dielectric layer 222, and the removing processes of the sacrificial sidewall spacer 206 and the main sidewall spacer 2044 are the same as those in the preceding embodiments, which are omitted here.

Figure 19:
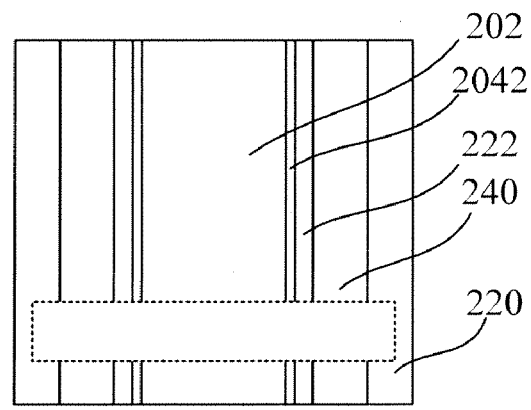

Finally, as shown in FIG. 19, the gate is formed from the gate stack 202, and the gate and the conducting layer are cut in a second direction different from the first direction.

In this embodiment, the second direction is perpendicular to the first direction, and the cut-out part is shown in the figure by a dashed block. In this embodiment, the contact plug 240 is also cut after the formation of the gate. Then, in forming the next interlayer dielectric layer 220, the gaps between gates and between contact plugs 240 resulting from the cutting are filled with the interlayer dielectric layer 220, so as to achieve isolation, which may further reduce possibility of interconnection between the contact plugs 240. If the gate stack 202 is made of polysilicon (i.e., a dummy gate), the gate may be formed with a gate-last process, and may be a stacked metal layer.

Figure 20:
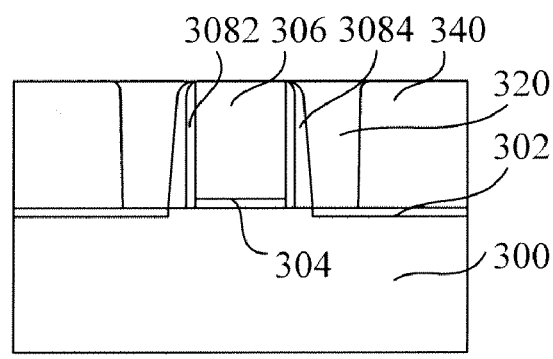
FIG. 20 to FIG. 23 illustrate structural diagrams of contact plugs according to the embodiments of the invention.

The invention also provides a contact plug. As shown in FIG. 20, a contact plug 320, a gate 306 (on top of a gate dielectric layer 304) and a sidewall spacer are formed on a substrate 300 and within an interlayer dielectric layer 340, and a side of the contact plug 320 abuts on the sidewall spacer 308.

In this specification, the substrate 300 has been formed with well regions and shallow trench isolation (STI) regions. In this embodiment, the substrate 300 is a silicon substrate. In other embodiments, the substrate 300 may comprise other compound semiconductors, e.g., silicon carbide, gallium arsenide, indium arsenide or indium phosphide. Preferably, the substrate 300 comprises an epitaxial layer. In addition, the substrate 300 may comprise a silicon-on-insulator (SOI) structure.

In this embodiment, the gate 306 is a metal gate (e.g., a stack of a work function metal layer and an aluminum/stacked aluminium-copper electrode, with the work function metal layer comprising one or more of TiN, TiAlN, TaN and TaAlN). The metal gate may be formed with the gate-first process or the gate-last process. In other embodiments, the gate 306 may be a polysilicon gate. The gate dielectric layer 304 may be made of a hafnium-based material, e.g., any one or more of $HfO_2$, HfSiO, HfSiON, HfTaO, HfTiO and HfZrO. The gate 306 and the gate dielectric layer 304 may be formed with conventional processes and materials.

The sidewall spacer may be made of any one or more of silicon nitride, silicon oxynitride and silicon carbide. The sidewall spacer may have a multilayered structure. For example, the sidewall spacer may comprise a sidewall spacer base layer 3082 and a main sidewall spacer 3084, and the material of the sidewall spacer base layer 3082 may be different from that of the main sidewall spacer 3084. Specifically, in this embodiment, the sidewall spacer base layer 3082 may be made of silicon oxynitride, and the main sidewall spacer 3084 may be made of silicon nitride. In such a case, the main sidewall spacer 3084 may also have a stacked structure. For example, the main sidewall spacer 3084 may have a stacked structure of silicon nitride-silicon oxynitride-silicon nitride. The main sidewall spacer 3084 covers side surfaces of the gate 306 with the sidewall spacer base layer 3082 formed therebetween, i.e., the sidewall spacer base layer 3082 is sandwiched between the main sidewall spacer 3084 and the side surfaces of the gate 306.

The contact plug 320 may comprise a contact liner (e.g., any one or more of TiN, Ti, TaN and Ta) and a metal layer (e.g., any one or more of Al, Ti, TiAl, Ta, W and Cu) covering the contact liner. The contact liner and the metal layer may be formed with sputtering, Pulsed Laser Deposition (PLD), Metal Organic Chemical Vapor Deposition (MOCVD), Atomic Layer Deposition (ALD), Plasma-Enhanced Atomic Layer Deposition (PEALD) or other suitable techniques. In order to reduce the contact resistance between the contact plug 320 and the substrate 300, a contact region 302 may be pre-formed on the substrate 300 prior to the formation of the contact plug 320.

Figure 21:
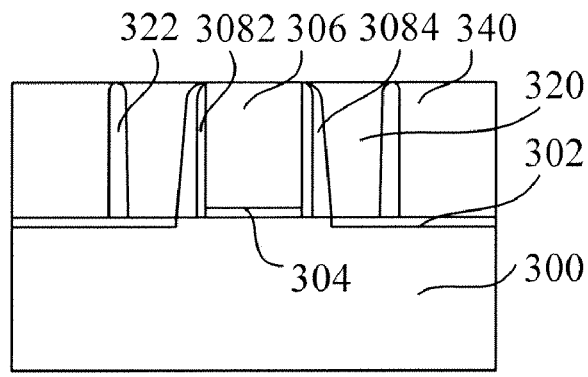

In another embodiment, as shown in FIG. 21, the contact plug 320 further comprises an auxiliary sidewall spacer 322 within the interlayer dielectric layer 340. The material of the auxiliary sidewall spacer 322 is different from the material of the interlayer dielectric layer 340, and the side of the contact plug 320 that is opposite to the side abutting on the sidewall spacer abuts the auxiliary sidewall spacer 322.

Figure 22:
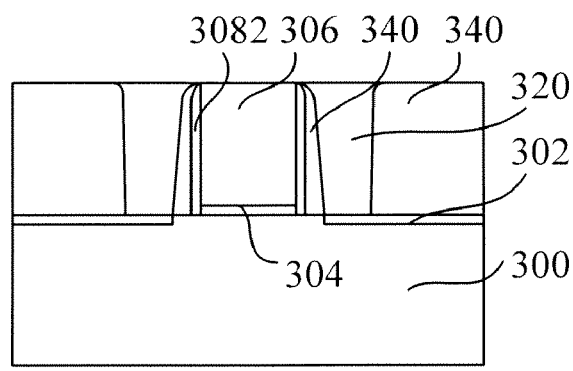
Figure 23:
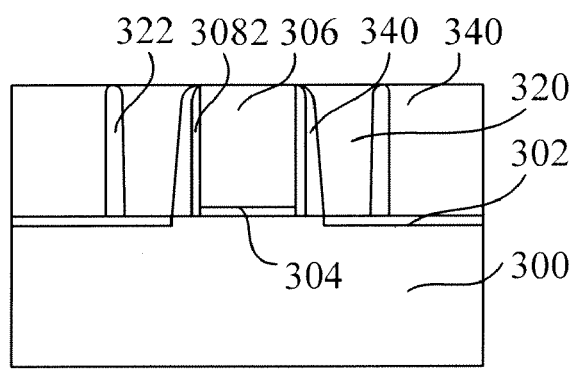

Based on the semiconductor device embodiments above, other embodiments of the invention may be obtained in such a case where the sidewall spacer comprises a sidewall spacer base layer 3082 and a main sidewall spacer 3084, with the material of the main sidewall spacer 3084 being different from that of the sidewall spacer base layer 3082, i.e., the sidewall spacer base layer 3082 is sandwiched between side surfaces of the gate 306 and the main sidewall spacer 3084, such that the main sidewall spacer 3084 is made of the same material as that of the interlayer dielectric layer 340. As an example, the resulting semiconductor device is shown in FIG. 22 and FIG. 23.

The invention also provides a semiconductor device comprising the contact plug 320 discussed above.

Figure 24:
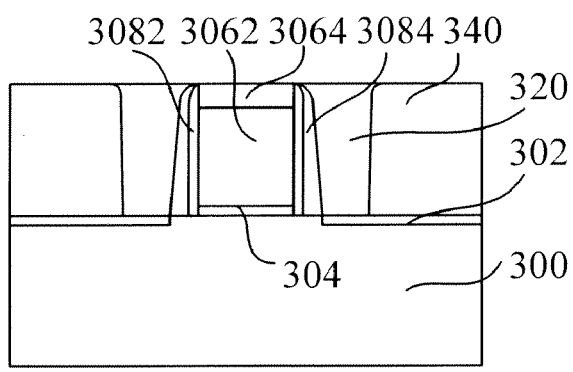
FIG. 24 illustrates a structural diagram of a semiconductor device according to an embodiment of the invention.

In another embodiment of the invention, as shown in FIG. 24, based on the semiconductor device above (e.g., the first embodiment), the gate 306 comprises a first part 3062 and a second part 3064, the second part 3064 being on the first part 3062 and made of the same material as the contact plug 320.

Generally, the material of the contact plug 320 has an electrical conductivity higher than the material of the gate 306. Therefore, by partially replacing the material of the gate 306 with the material of the contact plug 320, the resistance of the gate 306 may be lowered.

Furthermore, the scope of the invention is not limited to the processes, structures, manufacturing, substance compositions, means, methods and steps of the embodiments described herein. Based on the disclosure of the invention, those skilled in the art shall appreciate that, for those processes, structures, manufacturing, substance compositions, means, methods or steps known or to be developed, as long as their functions or effects are substantially the same as the corresponding embodiments described herein, they are applicable without deviation from the scope of the invention.

What is claimed is:

1. A method for forming a contact plug, comprising:
    forming a gate, a sidewall spacer, a sacrificial sidewall spacer, a source region and a drain region on a substrate, wherein the sidewall spacer is formed around the gate, the sacrificial sidewall spacer is formed to cover the sidewall spacer, and the source region and the drain region are formed within the substrate and on respective sides of the gate;
    forming an interlayer dielectric layer, with the gate, the sidewall spacer and the sacrificial sidewall spacer being exposed;
    removing the sacrificial sidewall spacer to form a contact space, wherein the sacrificial sidewall spacer is made of a material that is different from any of materials that the gate, the sidewall spacer and the interlayer dielectric layer are made of;
    forming a conducting layer to fill the contact space; and
    cutting off the conducting layer to form at least two conductors connected to the source region and the drain region, respectively.

2. The method according to claim 1, wherein the method further comprises the following step between forming the sacrificial sidewall spacer and forming the interlayer dielectric layer:
    forming an auxiliary sidewall spacer to cover the sacrificial sidewall spacer, wherein the auxiliary sidewall spacer is made of a material different from either of the materials of the sacrificial sidewall spacer and the interlayer dielectric layer.

3. The method according to claim 2, wherein the sidewall spacer comprises a sidewall spacer base layer and a main sidewall spacer, the main sidewall spacer is made of a material different from the material of the sacrificial sidewall spacer, and the sidewall spacer base layer is sandwiched between the main sidewall spacer and the gate, and wherein the method further comprises the following steps after forming the conducting layer:
    removing the main sidewall spacer to form an adjusted space; and
    forming a dielectric layer to fill the adjusted space.

4. The method according to claim 1, wherein the sidewall spacer comprises a sidewall spacer base layer and a main sidewall spacer, the main sidewall spacer is made of a material different from the material of the sacrificial sidewall spacer, and the sidewall spacer base layer is sandwiched between the main sidewall spacer and the gate, and wherein the method further comprises the following steps after forming the conducting layer:
    removing the main sidewall spacer to form an adjusted space; and
    forming a dielectric layer to fill the adjusted space.

5. The method according to claim 4, wherein the material of the auxiliary sidewall spacer is the same as that of the main sidewall spacer.

6. A method for forming a semiconductor device, comprising:
    forming a gate and a sidewall spacer on a substrate; and
    forming a contact plug on the substrate with the gate and the sidewall spacer formed thereon,
    wherein the contact plug is formed with the method according to claim 1.

7. A method for forming a contact plug, comprising:
    forming a gate stack, a sidewall spacer and a sacrificial sidewall spacer extending in a first direction on a substrate, wherein the sidewall spacer is formed to cover opposite side surfaces of the gate stack, and the sacrificial sidewall spacer is formed to cover the sidewall spacer;
    forming an interlayer dielectric layer, with the gate stack, the sidewall spacer and the sacrificial sidewall spacer being exposed;
    removing the sacrificial sidewall spacer to form a contact space, wherein the sacrificial sidewall spacer is made of a material that is different from any of materials that the gate stack, the sidewall spacer and the interlayer dielectric layer are made of
    forming a conducting layer to fill the contact space; and
    forming a gate from the gate stack, and cutting the gate and the conducting layer in a second direction different from the first direction.

8. The method according to claim 7, wherein the method further comprises the following step between forming the sacrificial sidewall spacer and forming the interlayer dielectric layer:
    forming an auxiliary sidewall spacer to cover the sacrificial sidewall spacer, wherein the auxiliary sidewall spacer is made of a material different from either of the materials of the sacrificial sidewall spacer and the interlayer dielectric layer.

9. The method according to claim 8, wherein the sidewall spacer comprises a sidewall spacer base layer and a main sidewall spacer, the main sidewall spacer is made of a material different from the material of the sacrificial sidewall spacer, and the sidewall spacer base layer is sandwiched between the main sidewall spacer and the gate, and the method further comprises the following steps after forming the conducting layer:

removing the main sidewall spacer to form an adjusted space; and forming a dielectric layer to fill the adjusted space.

10. The method according to claim 7, wherein the sidewall spacer comprises a sidewall spacer base layer and a main sidewall spacer, the main sidewall spacer is made of a material different from the material of the sacrificial sidewall spacer, and the sidewall spacer base layer is sandwiched between the main sidewall spacer and the gate, and the method further comprises the following steps after forming the conducting layer:

removing the main sidewall spacer to form an adjusted space; and forming a dielectric layer to fill the adjusted space.

11. The method according to claim 10, wherein the material of the auxiliary sidewall spacer is the same as that of the main sidewall spacer.

12. A method for forming a semiconductor device, comprising:

forming a gate and a sidewall spacer on a substrate; and forming a contact plug on the substrate with the gate and the sidewall spacer formed thereon, wherein the contact plug is formed with the method according to claim 7.

13. A contact plug, the contact plug, a gate and sidewall spacers being formed on a substrate and within an interlayer dielectric layer, and the sidewall spacers being formed to surround the gate, wherein all side surfaces of the contact plug abut on the sidewall spacers.

14. The contact plug according to claim 13, wherein an auxiliary sidewall spacer is formed within the interlayer dielectric layer, the auxiliary sidewall spacer is made of a material that is different from that of the interlayer dielectric layer, and a side of the contact plug that is opposite to the side abutting on the sidewall spacer abuts on the auxiliary sidewall spacer.

15. The contact plug according to claim 14, wherein the sidewall spacer comprises a sidewall spacer base layer and a main sidewall spacer, the sidewall spacer base layer is sandwiched between the main sidewall spacer and the gate, the main sidewall spacer is made of a material which is different from that of the sidewall spacer base layer and is the same as that of the interlayer dielectric layer.

16. A semiconductor device, comprising the contact plug according to claim 14.

17. The contact plug according to claim 13, wherein the sidewall spacer comprises a sidewall spacer base layer and a main sidewall spacer, the sidewall spacer base layer is sandwiched between the main sidewall spacer and the gate, the main sidewall spacer is made of a material which is different from that of the sidewall spacer base layer and is the same as that of the interlayer dielectric layer.

18. A semiconductor device, comprising the contact plug according to claim 17.

19. A semiconductor device, comprising the contact plug according to claim 13.

20. The semiconductor device according to claim 19, wherein the gate comprises a first part and a second part, the second part is located on the first part, and the second part is made of the same material as that of the contact plug.

\* \* \* \* \*